(12) United States Patent
Tsuboi et al.

(10) Patent No.: US 6,643,809 B2
(45) Date of Patent: Nov. 4, 2003

(54) SEMICONDUCTOR DEVICE AND SEMICONDUCTOR DEVICE TESTING METHOD

(75) Inventors: Hiroyoshi Tsuboi, Kawasaki (JP); Shinya Fujioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 458 days.

(21) Appl. No.: 09/764,415

(22) Filed: Jan. 19, 2001

(65) Prior Publication Data

US 2001/0017552 A1 Aug. 30, 2001

(30) Foreign Application Priority Data

Feb. 29, 2000 (JP) ........................................ 2000-054879

(51) Int. Cl.$^7$ .......................... G01R 3/28; H03K 19/003
(52) U.S. Cl. .......................... 714/724; 714/32; 714/718
(58) Field of Search .......................... 714/32, 718, 724

(56) References Cited

U.S. PATENT DOCUMENTS 5,072,137 A * 12/1991 Slemmer ...................... 326/16
5,369,643 A * 11/1994 Rastgar et al. ............... 714/724
5,408,435 A * 4/1995 McClure et al. ............. 365/201
6,490,700 B1 * 12/2002 Oshima et al. .............. 714/718

FOREIGN PATENT DOCUMENTS

| EP | 1-030-313 A2 | 8/2000 |
| JP | A-2000-149600 | 5/2000 |
| JP | A-2000-243098 | 9/2000 |

* cited by examiner

*Primary Examiner*—Albert Decady
*Assistant Examiner*—Matthew C. Dooley
(74) *Attorney, Agent, or Firm*—Arent Fox Kintner Plotkin & Kahn, PLLC

(57) ABSTRACT

A semiconductor device which has a test mode for testing the semiconductor device, is provided with a circuit which generates a first signal based on dummy command signals which are input thereto a plurality of times, and generates a second signal which instructs entry to a corresponding test mode or an exit from a corresponding test mode based on an address signal and the first signal.

6 Claims, 11 Drawing Sheets

SEMICONDUCTOR DEVICE AND SEMICONDUCTOR DEVICE TESTING METHOD

BACKGROUND OF THE INVENTION

This application claims the benefit of a Japanese Patent Application No. 2000-054879 filed Feb. 29, 2000, in the Japanese Patent Office, the disclosure of which is hereby incorporated by reference.

1. Field of the Invention

The present invention generally relates to semiconductor devices and semiconductor device testing methods, and more particularly to a semiconductor device having a test mode, and to a semiconductor device testing method for testing such a semiconductor device.

Generally, when guaranteeing functions and performances of semiconductor devices such as semiconductor memory devices at the time of forwarding the semiconductor devices or, when a user checks abnormalities of the semiconductor device, a command is input to the semiconductor device to switch an operation mode thereof to a test mode, so as to carry out various kinds of tests. The switching of the operation mode of the semiconductor device from a normal mode to the test mode is often referred to as a test mode entry.

2. Description of the Related Art

In a conventional synchronous dynamic random access memory (SDRAM), the test mode entry is made by inputting a command to the SDRAM in synchronism with an external clock, for example, and a timing control can be made with ease. In addition, in a case where the command is determined by a predetermined combination of signals such as a chip select signal and an address strobe signal, the test mode entry is erroneously made if the predetermined combination of the signals occurs accidentally. Accordingly, it is possible to use a command signal exclusively for switching the operation mode of the semiconductor device to the test mode, but in this case, it is necessary to provide an input pin exclusively for receiving the command signal. But the provision of this additional input pin for exclusively receiving the command signal increases the circuit scale of the SDRAM, thereby making it difficult to improve the integration density of the SDRAM.

On the other hand, in an asynchronous DRAM, it is not possible to employ a test mode entry system of the type employed in the SDRAM, because the asynchronous DRAM does not use an external clock. Thus, in one example of the conventional asynchronous DRAM, the test mode entry is made by applying a super-high voltage which is higher than a voltage which is normally applied with respect to the asynchronous DRAM. However, when this test mode entry system is employed, it is necessary to provide a circuit for detecting the super-high voltage in the asynchronous DRAM. As a result, the circuit scale of the asynchronous DRAM increases, and it becomes difficult to improve the integration density of the asynchronous DRAM. Furthermore, when the super-high voltage is used, the number of kinds of voltages applied to the asynchronous DRAM increases, and it becomes necessary to carry out a process such as waiting for the super-high voltage to be released, thereby making the testing process complex.

Therefore, in the conventional semiconductor devices, there were problems in that it is impossible to simply and positively make the test mode entry, regardless of whether the semiconductor device is the synchronous type or the asynchronous type, and without increasing the circuit scale of the circuits within the semiconductor device or sacrificing the integration density of the semiconductor device.

SUMMARY OF THE INVENTION

Accordingly, it is a general object of the present invention to provide a novel and useful semiconductor device and semiconductor device testing method, in which the problems described above are eliminated.

Another and more specific object of the present invention is to provide a semiconductor device and a semiconductor device testing method, which can simply and positively make a test mode entry, regardless of whether the semiconductor device is the synchronous type or the asynchronous type, and without increasing the circuit scale of circuits within the semiconductor device or sacrificing the integration density of the semiconductor device.

Still another object of the present invention is to provide a semiconductor device having a test mode for testing the semiconductor device, comprising a circuit which generates a first signal based on dummy command signals which are input thereto a plurality of times, and generates a second signal which instructs entry to a corresponding test mode or an exit from a corresponding test mode based on an address signal and the first signal. According to the semiconductor device of the present invention, it is possible to simply and positively make a test mode entry, regardless of whether the semiconductor device is the synchronous type or the asynchronous type, and without increasing the circuit scale of circuits within the semiconductor device or sacrificing the integration density of the semiconductor device.

In the semiconductor device, the dummy command signals may be formed by a predetermined combination of a plurality of command signals. Further, the circuit may include a plurality of registers which successively store the dummy command.

A further object of the present invention is to provide a semiconductor device testing method for testing a semiconductor device by switching an operation mode of the semiconductor device to a test mode, comprising the steps of (a) outputting a first signal based on dummy command signals which are input a plurality of times, and (b) outputting a second signal which instructs an entry to a corresponding test mode or an exit from a corresponding test mode based on an address signal and the first signal. According to the semiconductor device testing method of the present invention, it is possible to simply and positively make a test mode entry, regardless of whether the semiconductor device is the synchronous type or the asynchronous type, and without increasing the circuit scale of circuits within the semiconductor device or sacrificing the integration density of the semiconductor device.

In the semiconductor device testing method, the dummy command signals may be formed by a predetermined combination of a plurality of command signals.

Other objects and further features of the present invention will be apparent from the following detailed description when read in conjunction with the accompanying drawings.

DESCRIPTION OF THE PREFERRED EMBODIMENTS

Figure 1:
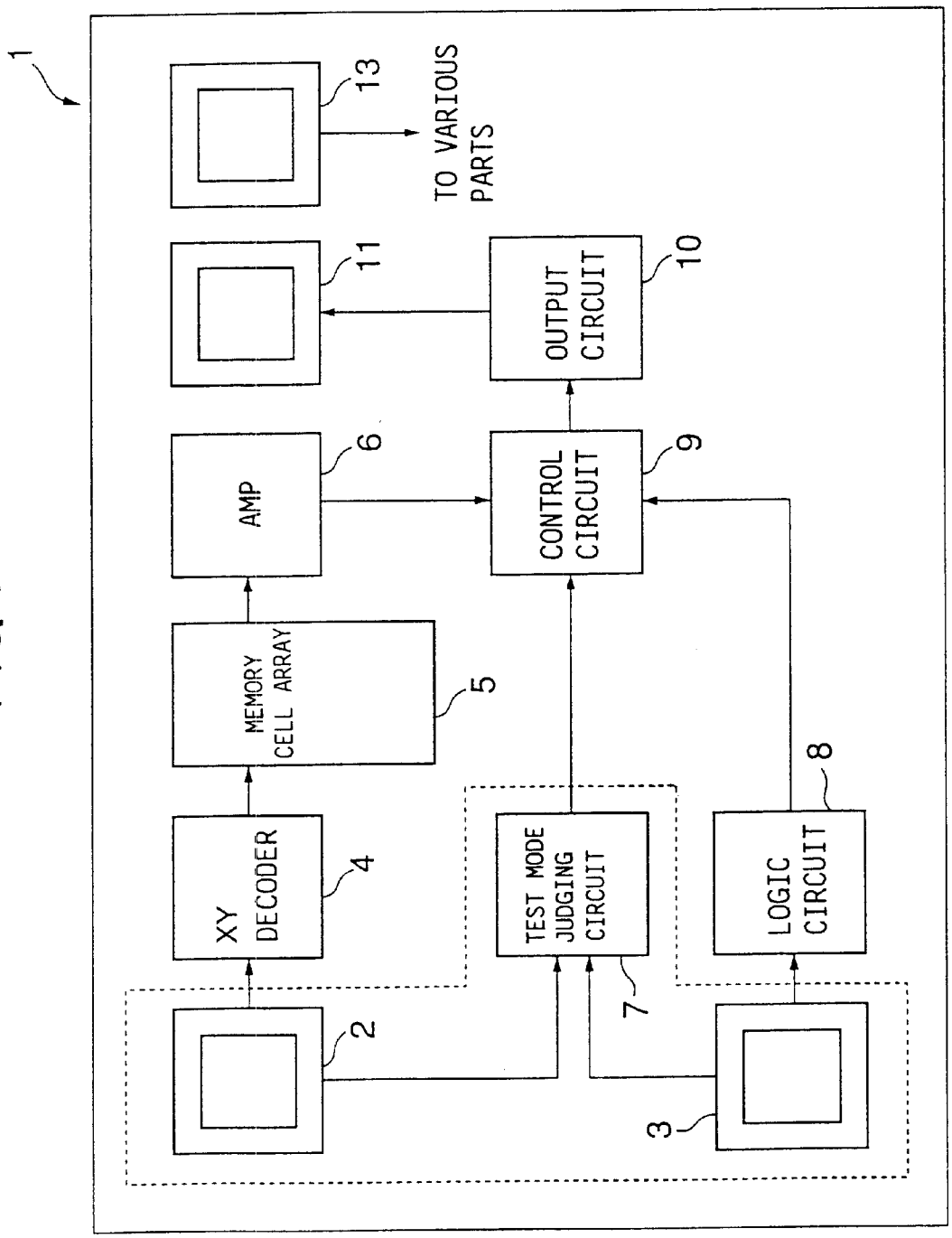
FIG. 1 is a system block diagram showing a first embodiment of a semiconductor device according to the present invention.

A description will be given of embodiments of a semiconductor device according to the present invention and a semiconductor device testing method according to the present invention, by referring to the drawings.

FIG. 1 is a system block diagram showing a first embodiment of the semiconductor device according to the present invention. This first embodiment of the semiconductor device employs a first embodiment of the semiconductor device testing method according to the present invention. In this first embodiment, the present invention is applied to an asynchronous DRAM, but the present invention is of course similarly applicable to other semiconductor devices and semiconductor memory devices such as a SDRAM.

An asynchronous DRAM 1 generally includes an address pad group 2, a command pad group 3, a XY decoder 4, a memory cell array 5, an amplifier 6, a test mode judging circuit 7, a logic circuit 8, a control circuit 9, an output circuit 10, an output pad group 11, and a power supply pad group 13 which are connected as shown in FIG. 1. For the sake of convenience, FIG. 1 only shows circuit parts of the DRAM 1 related to a test mode.

The address pad group 2 is made up of a plurality of address pads which receive an address signal. The XY decoder 4 decodes the address signal from the address pad group 2, and specifies a X-address and a Y-address of the memory cell array 5. A data can be written to and read from the memory cell array 5 by known methods, and thus, a description of write and read operations will be omitted in this specification. The amplifier 6 amplifies the data which is read from the specified XY addresses of the memory cell array 5, and outputs the amplified data to the control circuit 9.

The command pad group 3 is made up of a plurality of command pads which receive various kinds of command signals, including a write command and a read command. A command signal from the command pad group 3 is supplied to the test mode judging circuit 7 and the logic circuit 8. The test mode judging circuit 7 judges whether an operation mode of the DRAM 1 is a normal mode or the test mode, based on the address signal and the command signal. If the operation mode is judged as being the test mode, the test mode judging circuit 7 supplies a test signal to the control circuit 9. On the other hand, the logic circuit 8 carries out various kinds of logic operations based on the command signal, and supplies an output enable signal which indicates a result of a timing judgement or the like to the control circuit 9.

The test signal from the test mode judging circuit 7 disables the control circuit 9 from outputting the data from the amplifier 6. On the other hand, an output enable signal from the logic circuit 8 enables the control circuit 9 to output the data from the amplifier 6. In the normal mode, the test signal has a low level, and the control circuit 9 controls an output impedance of the output circuit 10 to a high-impedance or a low-impedance, depending on a level of the output enable signal during the read operation. On the other hand, in the test mode, the test signal has a high level, the control circuit 9 guarantees the output impedance of the output circuit 10 to be a high-impedance regardless of the level of the output enable signal, and no output current flows.

The output circuit 10 includes output transistors, and outputs the data which is obtained from the amplifier 6 via the control circuit 9 to the output pad group 11. The output pad group 11 is made up of a plurality of output pads. The power supply pad group 13 is made up of a plurality of power supply pads which receive at least one power supply voltage. In this embodiment, the power supply pad group 11 is made up of a plurality of power supply pads which receive power supply voltages which are to be supplied to various parts within the DRAM 1.

Figure 2:
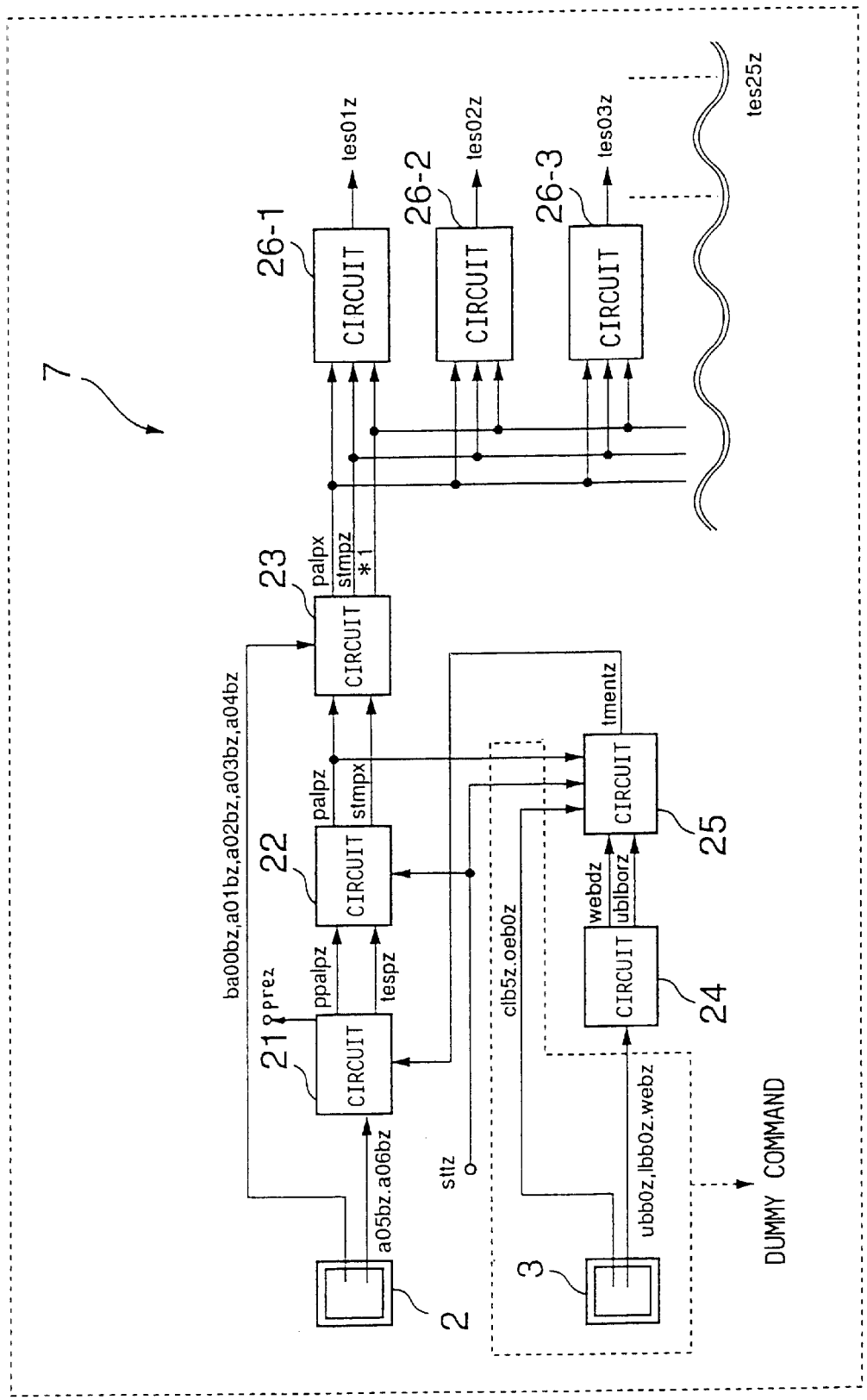
FIG. 2 is a system block diagram showing an embodiment of a test mode judging circuit.

FIG. 2 is a system block diagram showing an embodiment of the test mode judging circuit 7. A circuit part shown in FIG. 2 corresponds to a circuit part surrounded by dotted lines in FIG. 1.

The test mode judging circuit 7 includes circuits 21 through 35, and circuits 26-1 through 26-25 which are connected as shown in FIG. 2. For the sake of convenience, FIG. 2 only shows the circuits 26-1 through 26-3 of the circuits 26-1 through 26-25. The circuit 21 outputs a precharge signal prez, a reset signal ppalpz and an entry signal tespz, based on address signals a05bz and a06bz from the address pad group 2 and a signal tmentz from the circuit 25 which will be described later, and controls the entry to the test mode by the entry signal tespz and the exit from the test mode by the reset signal ppalpz. The precharge signal prez is used within the DRAM 1 in a mode other than the test mode, and is not directly related to the operation of this embodiment. The circuit 22 outputs a set signal stmpx and a reset signal palpz, based on a signal sttz which is generated within the DRAM 1 when a voltage is applied to predetermined power supply pads of the power supply pad group 13 and the reset signal ppalpz and the entry signal tespz from the circuit 21, and sets or resets flip-flops within the circuits 26-1 through 26-25 which will be described later. The circuit 23 outputs complementary signals *1 by amplifying address signals ba00bz, a01bz, a02bz, a03bz and a04bz from the address pad group 2, and also outputs the set signal stmpx and the reset signal palpz from the circuit 22 as set signal stmpz and a reset signal palpx, respectively. The complementary signals *1 are signals a00cz through 104cz and signals a00cx through a04cx.

Each of the circuits 26-1 through 26-25 receives the complementary signals *1, the set signal stmpz and the reset signal palpx from the circuit 23, and the flip-flop within each of the circuits 26-1 through 26-25 sets the data depending on the set signal stmpz or resets the data depending on the reset signal palpx, so as to make the entry to or the exit from the test mode. Accordingly, corresponding test signals tes01z, tes02z, tes03z, . . . , and tes25z are output from the circuits 26-1, 26-2, 26-3, . . . , and 26-25.

On the other hand, the circuit 24 is provided to prevent an erroneous entry to the test mode. Command signals ubb0z, lbb0z and webz from the command pad group 3 are input to the circuit 24. The circuit 24 outputs signals webdz and ublborz based on the command signals ubb0z, lbb0z and webz. The circuit 25 generates a signal tmentz which is supplied to the circuit 21, based on command signals clb5z and oeb0z from the command pad group 3, the signals webdz and ublborz from the circuit 24 and the signals palpz and sttz from the circuit 23.

In this embodiment, the command signals ubb0z, lbb0z, webz, clb5z and oeb0z which are input to the command pad group 3 to make the test mode entry are not the write command or the read command itself, but are command signals such as a chip enable signal CE, an output enable signal OE, a write enable signal WE, an upper byte signal UB and a lower byte signal LB. The operation mode of the DRAM 1 can be switched to the test mode by inputting a predetermined combination of these command signals ubb0z, lbb0z, webz, clb5z and oeb0z a plurality of times as dummy command signals.

Figure 3:
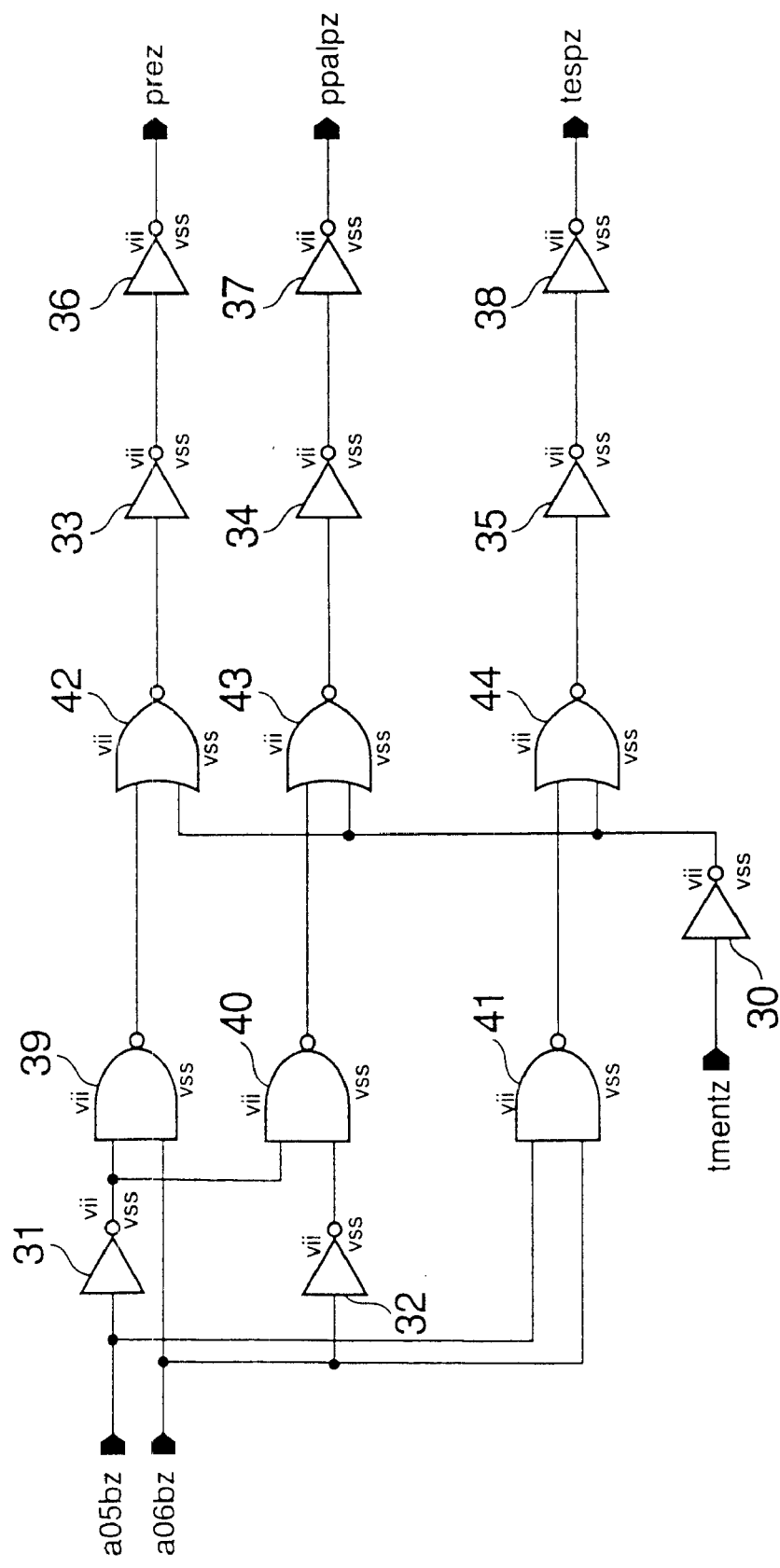
FIG. 3 is a circuit diagram showing a part of the test mode judging circuit in more detail.
Figure 4:
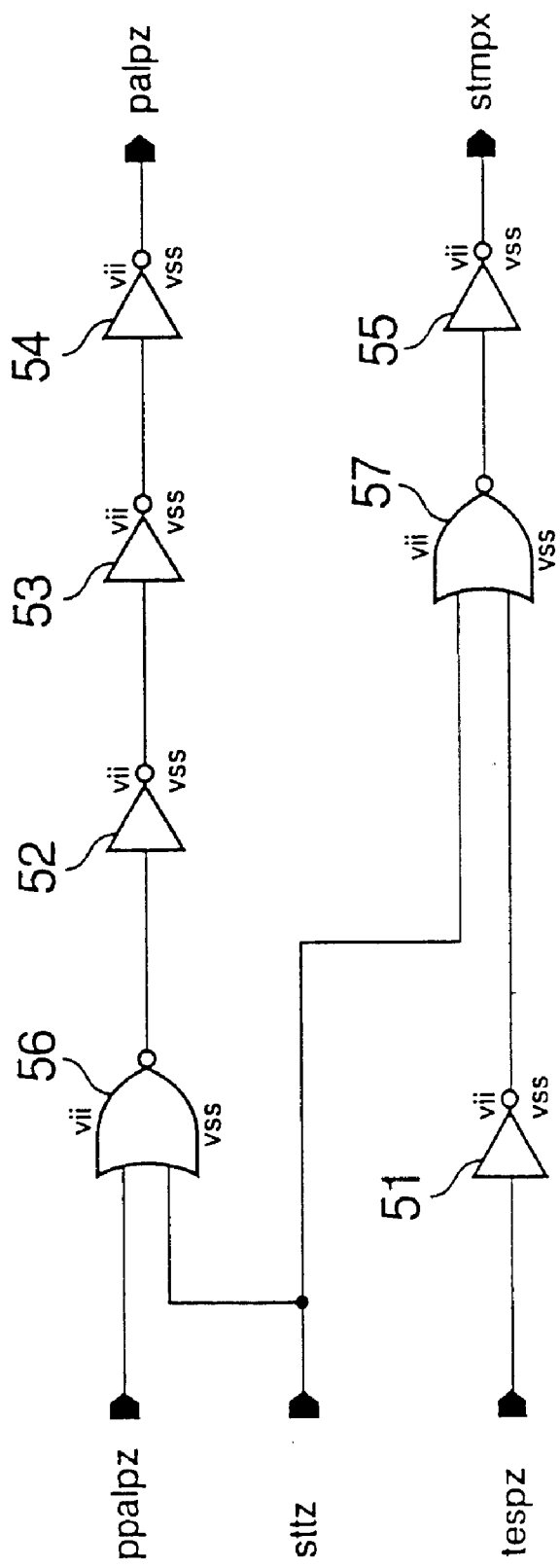
FIG. 4 is a circuit diagram showing a part of the test mode judging circuit in more detail.
Figure 5:
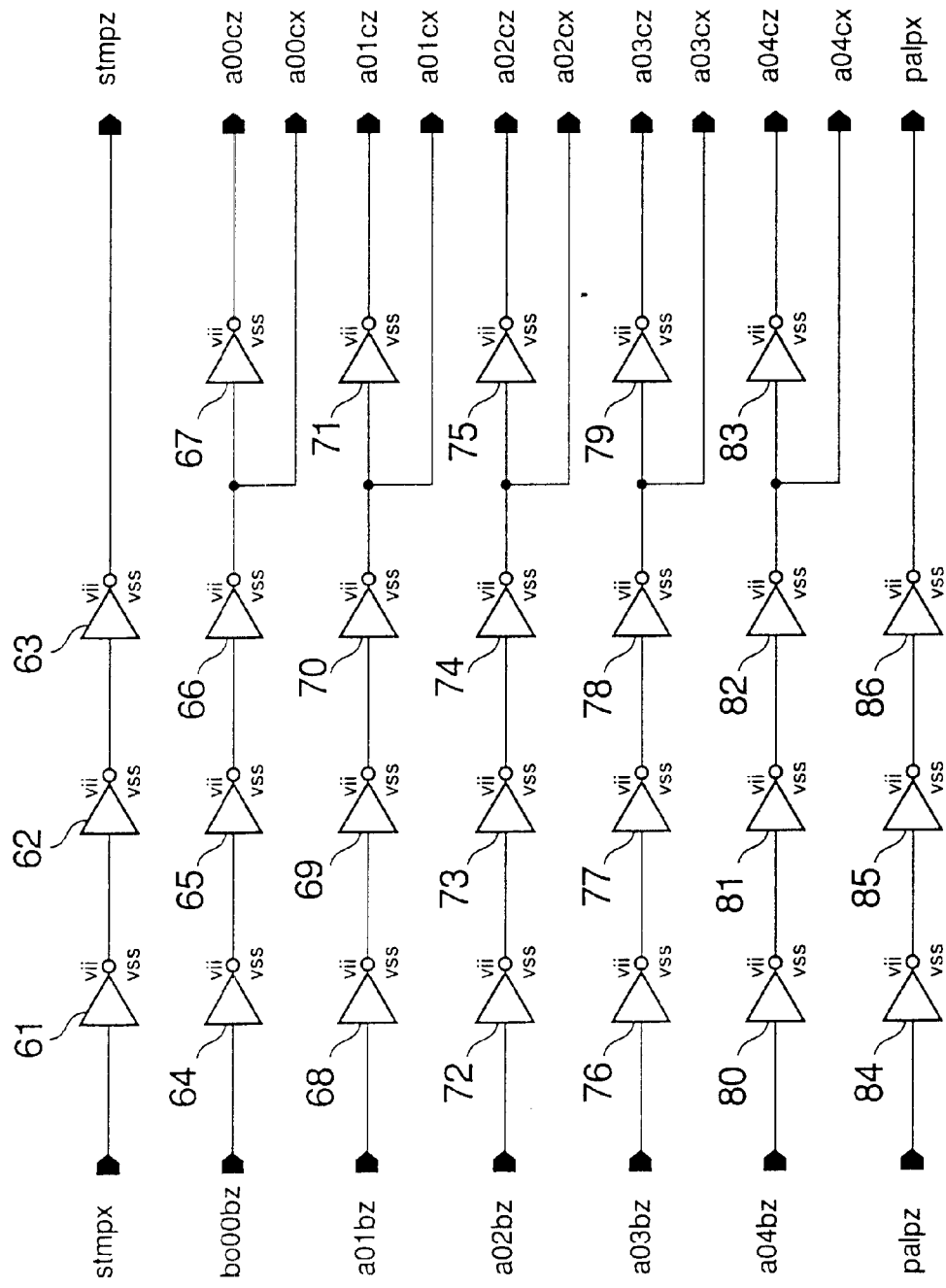
FIG. 5 is a circuit diagram showing a part of the test mode judging circuit in more detail.
Figure 6:
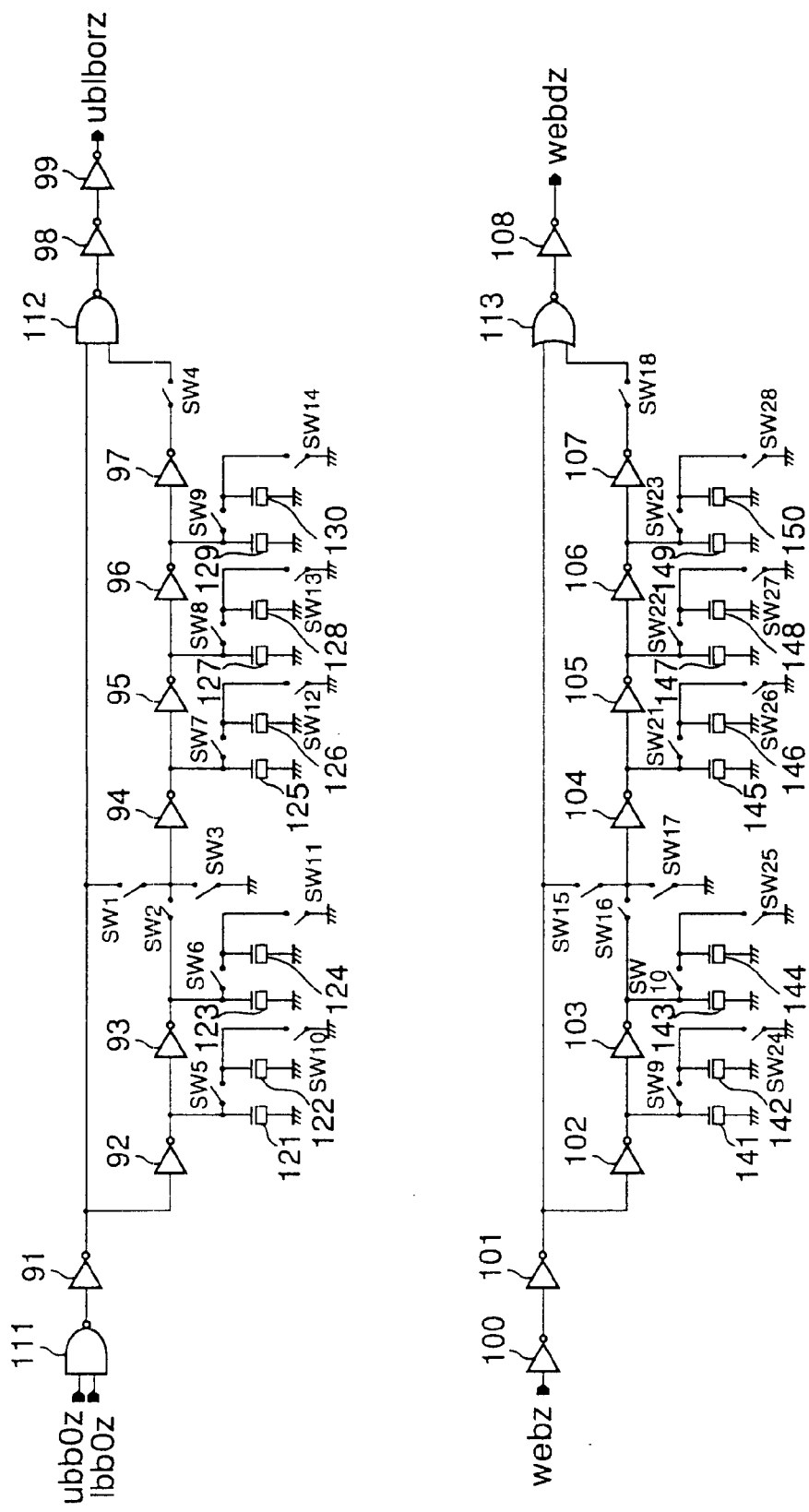
FIG. 6 is a circuit diagram showing a part of the test mode judging circuit in more detail.
Figure 7:
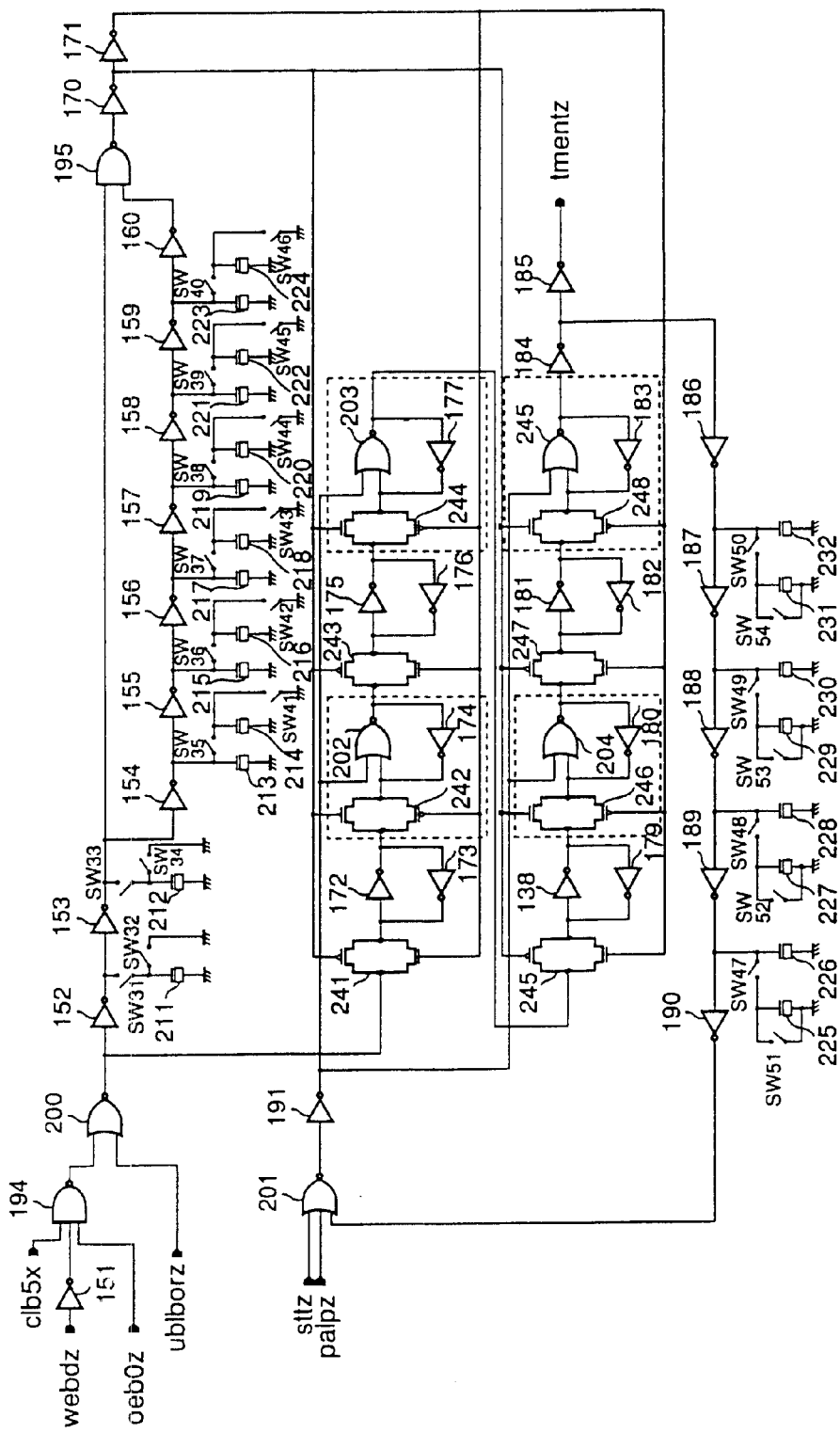
FIG. 7 is a circuit diagram showing a part of the test mode judging circuit in more detail.
Figure 8:
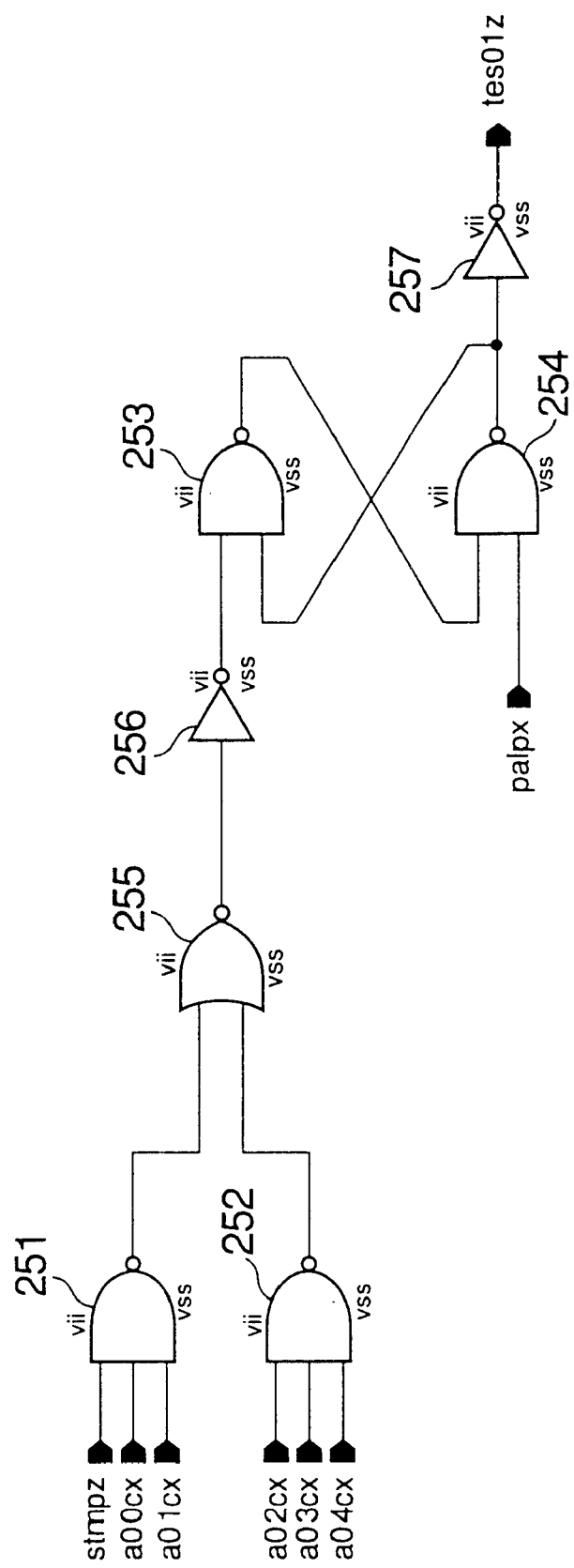
FIG. 8 is a circuit diagram showing a part of the test mode judging circuit in more detail.

FIGS. 3 through 8 respectively are circuit diagrams showing parts of the test mode judging circuit 7 in more detail. More particularly, FIG. 3 shows the circuit 21, FIG. 4 shows the circuit 22, FIG. 5 shows the circuit 23, FIG. 6 shows the circuit 24, FIG. 7 shows the circuit 25, and FIG. 8 shows the circuit 26-1. In FIGS. 3 through 8, vii denotes a power supply voltage, and vss denotes a ground voltage.

The circuit 21 includes inverters 30 through 38, NAND gates 39 through 41, and NOR gates 42 through 44 which are connected as shown in FIG. 3. The signal tmentz from the circuit 25 is input to the inverter 30. In addition, the address signal a05bz from the address pad group 2 is input to the inverter 31 and the NAND gate 41, and the address signal a06bz from the address pad group 2 is input to the inverter 32 and the NAND gates 39 and 41. The signals prez, ppalpz and tespz are respectively output from the inverters 36, 37 and 38.

The circuit 22 includes inverters 51 through 55, and NOR gates 56 and 57 which are connected as shown in FIG. 4. The signal sttz is generated within the DRAM 1 when a voltage is applied to predetermined power supply pads of the power supply pad group 13, and this signal sttz is input to the NOR gates 56 and 57. In addition, the signals ppalpz and tespz from the circuit 21 are respectively input to the NOR gate 56 and the inverter 51. The signals palpz and stmpx are respectively output from the inverters 54 and 55.

The circuit 23 includes inverters 61 through 86 which are connected as shown in FIG. 5. The signals stmpx and palpz from the circuit 22 are respectively input to the inverters 61 and 84. In addition, the address signals ba00bz, a01bz, a02bz, a03bz and a04bz from the address pad group 2 are respectively input to the inverters 64, 68, 72, 76 and 80. The signals stmpz and palpx are respectively output from the inverters 63 and 86, and the complementary signals *1, that is, the signals a00cz, a00cx, a01cz, a01cx, a02cz, a02cx, a03cz, a03cx, a04cz and a04cx, are respectively output from the inverters 67, 66, 71, 70, 75, 74, 79, 78, 83 and 82.

The circuit 24 shown in FIG. 6 includes inverters 91 through 108, NAND gates 111 and 112, a NOR gate 113, delay elements (MOS capacitors) 121 through 130 and 141 through 150, and switches SW1 through SW28 which are connected as shown in FIG. 6. The command signals ubb0z, lbb0z from the command pad group 3 are input to the NAND gate 111, and the command signal webz from the command pad group 3 is input to the inverter 100. The signals ublborz and webdz are respectively output from the inverters 99 and 108.

The circuit 25 includes inverters 151 through 191, NAND gates 194 and 195, NOR gates 200 through 205, delay elements (MOS capacitors) 211 through 232, transistor pairs 241 through 248, and switches SW31 through SW50 which are connected as shown in FIG. 7. The signals webdz and ublborz from the circuit 24 are respectively input to the inverter 151 and the NOR gate 200. In addition, the command signals clb5z and oeb0z from the command pad group 3 are both input to the NAND gate 194. In this embodiment, an output signal of the inverter 190, the signal sttz generated within the DRAM 1, and the signal palpz from the circuit 22 are input to the NOR gate 201. The signal tmentz is output from the inverter 185. In FIG. 7, circuit parts surrounded by dotted lines respectively correspond to a register.

The circuit 26-1 includes NAND gates 251 through 254, a NOR gate 255, and inverters 256 and 257 which are connected as shown in FIG. 8. The NAND gates 253 and 254 form a flip-flop. The signals stmpz, a00cx and a01cx from the circuit 23 are input to the NAND gate 251, and the signals a02cx, a03cx and a04cx from the circuit 23 are input to the NAND gate 252. In addition, the signal palpx from the circuit 23 is input to the NAND gate 254. The test signal tes01z is output from the inverter 257. The other circuits 26-2 through 26-25 may be constructed similarly to the circuit 26-1 described above so as to output the corresponding test signals tes02z through tes25z, and an illustration and description thereof will be omitted.

Figure 9:
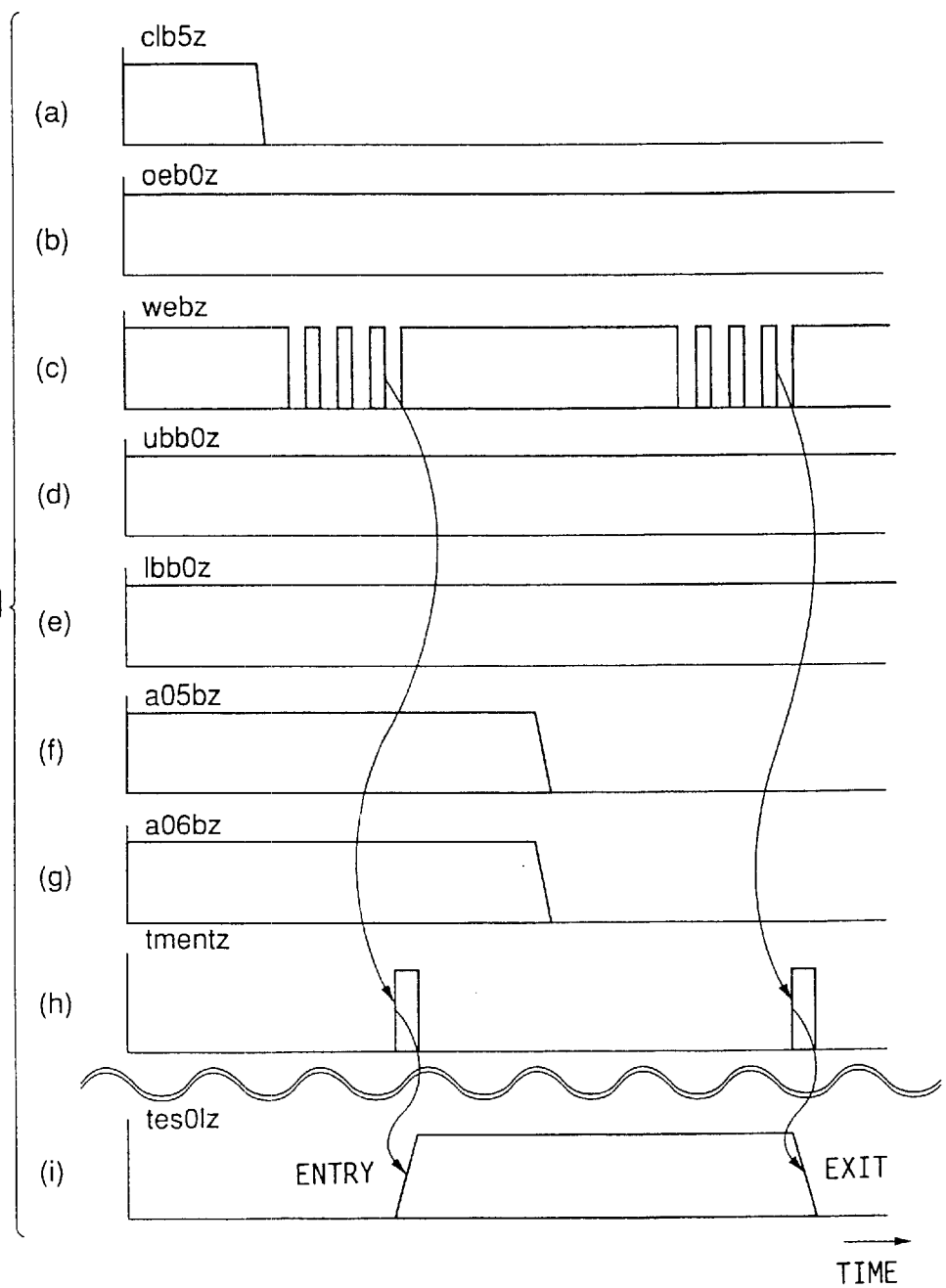
FIG. 9 is a timing chart for explaining an operation of the first embodiment.

FIG. 9 is a timing chart for explaining the operation of this first embodiment. FIGS. 9(a), 9(b), 9(c), 9(d) and 9(e) respectively show the command signals clb5z, oeb0z, webz, ubb0z and lbboz which are input to the command pad group 3. FIGS. 9(f) and 9(g) respectively show the address signals a05bz and a06bz which are input to the address pad group 2. In addition, FIG. 9(h) shows the signal tmentz which is output from the circuit 25, and FIG. 9(i) shows the test signal tes01z which is output from the circuit 26-1.

As shown in FIG. 9, when making the test mode entry, a low-level command signal webz is input a plurality of times in a state where the command signal clb5z has a low level, the command signal oeb0z has a high level, the command signal ubb0z has a high level and the command signal lbb0z has a high level, as dummy command signals. In addition, by respectively setting the address signals a05bz and a06bz to a high level when inputting the dummy command signals, it is possible to issue an entry instruction which is triggered by the signal tmentz. Accordingly, of the test signals tes01z through tes25z, the test signal test0z assumes a high level in this case, and instructs entry to the specified test mode. In addition, by respectively setting the address signals a05bz and a06bz to a low level when inputting the dummy command signals, it is possible to issue an exit instruction which is triggered by the signal tmentz. As a result, of the test signals tes01z through tes25z, the test signal tes01z assumes a low level in this case, and instructs exit from the specified test mode.

Figure 10:
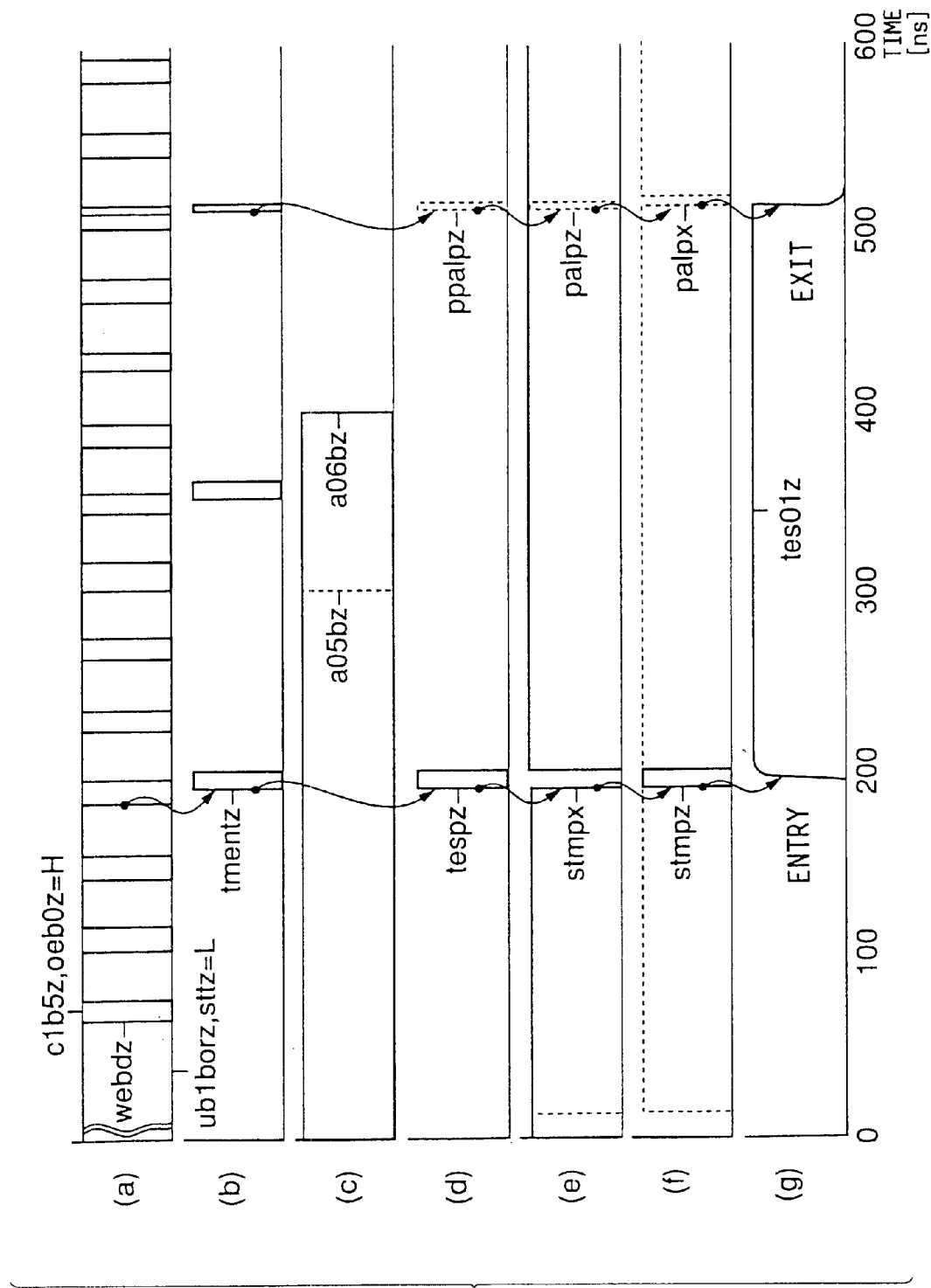
FIG. 10 is a timing chart for explaining the operation of the first embodiment.

FIG. 10 is a timing chart for explaining the operation of this first embodiment, and shows signals which are not shown in FIG. 9. FIG. 10(a) shows the command signals clb5z and oeb0z which are input to the command pad group 3, the signals webdz and ublborz which are output from the circuit 24, and the signal sttz, where H indicates a high level of the signal and L indicates a low level of the signal. FIG.

10(b) shows the signal tmentz which is output from the circuit 25, and FIG. 10(c) shows the address signals a05bz and a06bz which are input to the address pad group 2. In addition, FIG. 10(d) shows the signals tespz and ppalpz which are output from the circuit 21, and FIG. 10(e) shows the signals stmpx and palpz which are output from the circuit 22. FIG. 10(f) shows the signals stmpz and palpx which are output from the circuit 23, and FIG. 10(g) shows the test signal tes01z which is output from the circuit 26-1.

As shown in FIG. 10(b), a high-level signal tmentz is generated by repeatedly inputting a low-level command signal webdz four times. As shown in FIG. 10(b) and FIG. 10(d), a high-level signal tespz is generated and an entry command is issued using the high-level signal tmentz as a trigger. As shown in FIG. 10(d) and FIG. 10(e), a low-level signal stmpx is generated to set the flip-flop using the high-level signal tespz as a trigger. In addition, as shown in FIG. 10(e) and FIG. 10(f), a high-level signal stmpz is generated by inverting and amplifying the signal stmpx. This signal stmpz is sets the complementary signals *1 from the circuit 23 to the flip-flop within the circuit 26-1 corresponding to the specified test mode. Furthermore, as shown in FIG. 10(f) and FIG. 10(g), when the set data is output from the circuit 26-1, the test signal tes01z assumes a high level, and the entry is made to the specified test mode.

On the other hand, as shown in FIG. 10(b), FIG. 10(c) and FIG. 10(d), a high-level signal ppalpz is generated and an exit command is issued using a high-level signal tmentz as a trigger, when both the address signals a05bz and a06bz have a low level. In addition, as shown in FIG. 10(d) and FIG. 10(e), a high-level signal palpz is generated to reset the flip-flop using the high-level signal ppalpz as a trigger. As shown in FIG. 10(e) and FIG. 10(f), a low-level signal palpx is generated by inverting and amplifying the signal palpz. This signal palpx resets the flip-flop within the circuit 26-1 corresponding to the specified test mode. Moreover, as shown in FIG. 10(f) and FIG. 10(g), when the flip-flop within the circuit 26-1 is reset, the test signal tes01z assumes a low level, and the exit is made from the specified test mode.

Next, a description will be given of a second embodiment of the semiconductor device according to the present invention. This embodiment of the semiconductor device employs a second embodiment of the semiconductor device testing method according to the present invention. In this second embodiment, the present invention is applied to an asynchronous DRAM, and the basic construction of the asynchronous DRAM is the same as that of the first embodiment shown in FIG. 1 and described above. For this reason, an illustration and description of the basic construction of this second embodiment of the semiconductor device will be omitted.

Figure 11:
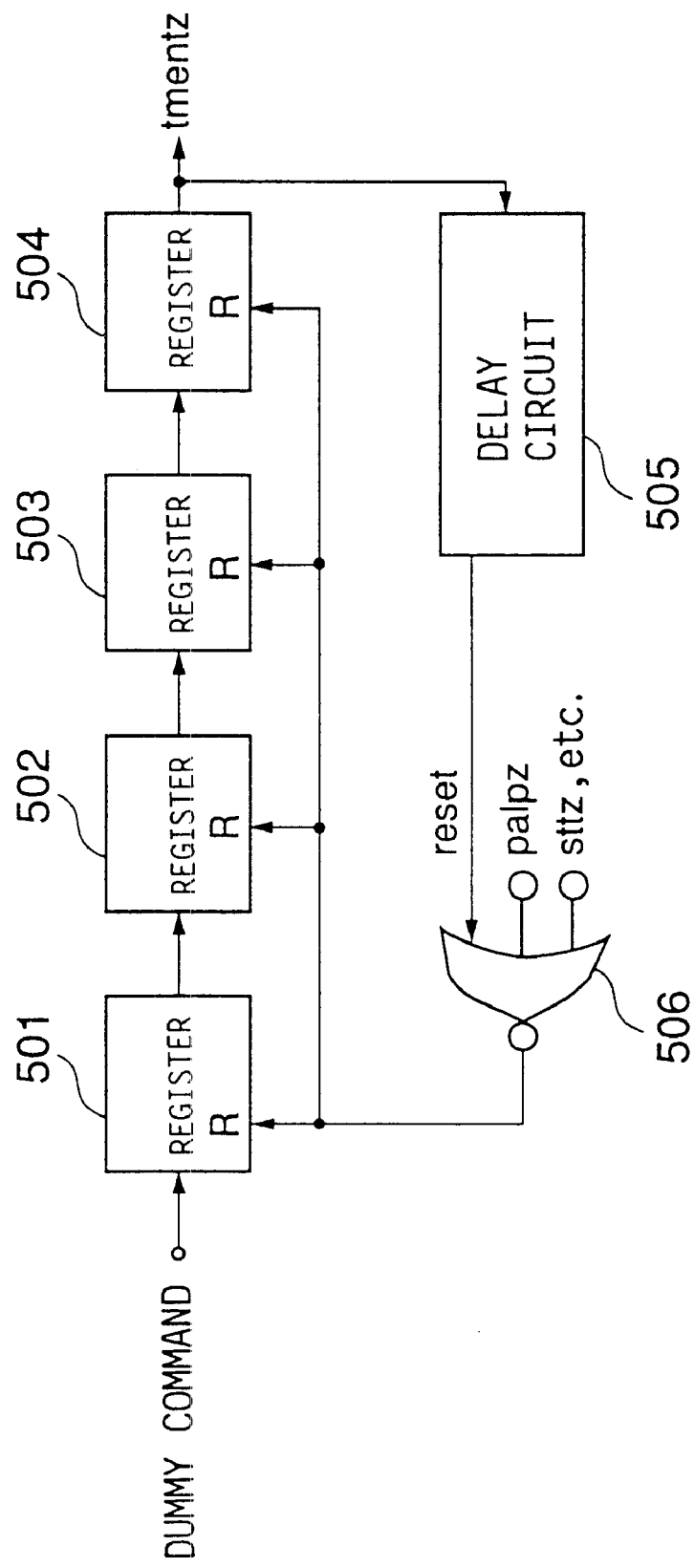
FIG. 11 is a system block diagram showing an important part of a second embodiment of the semiconductor device according to the present invention.

FIG. 11 is a system block diagram showing an embodiment of an important part of the test mode judging circuit 7 in this second embodiment. The test mode judging circuit 7 includes registers 501 through 504, a delay circuit 505, and a NOR circuit 506 which are connected as shown in FIG. 11. A dummy command is input a plurality of times to the register 501 provided in the first stage of the registers 501 through 504 which are connected in series. The test signal tmentz is output from the register 504 provided at the final stage of the registers 501 through 504. This test signal tmentz is supplied to the delay circuit 505 which supplies a reset signal "reset" to the NOR circuit 506. The signals palpz, sttz and the like described above are also supplied to the NOR circuit 506. An output signal of the NOR circuit 506 is input to reset terminals R of each of the registers 501 through 504 to reset these registers 501 through 504. Accordingly, the delay circuit 505 controls the timing at which the registers 501 through 504 are reset, based on the test signal tmentz. In addition, it is also possible to reset the registers 501 through 504 based on the signals palpz, sttz and the like.

Further, the present invention is not limited to these embodiments, but various variations and modifications may be made without departing from the scope of the present invention.

What is claimed is:

1. A semiconductor device having a test mode for testing the semiconductor device, comprising:

a circuit which generates a first signal based on dummy command signals which are input thereto a plurality of times, and generates a second signal which instructs entry to a corresponding test mode or an exit from a corresponding test mode based on an address signal and the first signal.

2. The semiconductor device as claimed in claim 1, wherein the dummy command signals are formed by a predetermined combination of a plurality of command signals.

3. The semiconductor device as claimed in claim 2, wherein said circuit includes a plurality of registers which successively store the dummy command.

4. The semiconductor device as claimed in claim 1, wherein said circuit includes a plurality of registers which successively store the dummy command.

5. A semiconductor device testing method for testing a semiconductor device by switching an operation mode of the semiconductor device to a test mode, comprising the steps of:

(a) outputting a first signal based on dummy command signals which are input a plurality of times; and (b) outputting a second signal which instructs an entry to a corresponding test mode or an exit from a corresponding test mode based on an address signal and the first signal.

6. The semiconductor device testing method as claimed in claim 5, wherein the dummy command signals are formed by a predetermined combination of a plurality of command signals.

* * * * *